US009653209B2

(12) United States Patent
Seko

(10) Patent No.: US 9,653,209 B2
(45) Date of Patent: May 16, 2017

(54) METHOD FOR PRODUCING ELECTRONIC COMPONENT

(71) Applicant: MURATA MANUFACTURING CO., LTD., Kyoto (JP)

(72) Inventor: Atsushi Seko, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 516 days.

(21) Appl. No.: 14/142,418

(22) Filed: Dec. 27, 2013

(65) Prior Publication Data
US 2014/0224418 A1 Aug. 14, 2014

(30) Foreign Application Priority Data
Feb. 8, 2013 (JP) ................................. 2013-023450

(51) Int. Cl.
| H01F 41/04 | (2006.01) |
| H01F 17/00 | (2006.01) |
| H05K 3/00 | (2006.01) |

(52) U.S. Cl.
CPC ....... *H01F 41/041* (2013.01); *H01F 17/0013* (2013.01); *H05K 3/0052* (2013.01); *H05K 2203/0228* (2013.01); *Y10T 156/1052* (2015.01)

(58) Field of Classification Search
CPC . H01F 17/0013; H01F 41/041; H05K 3/0052; H05K 2203/0228; Y10T 156/1052
See application file for complete search history.

(56) References Cited

U.S. PATENT DOCUMENTS

| 4,852,227 A | 8/1989 | Burks |
| 6,035,528 A | 3/2000 | Sasaki et al. |
| 2002/0008606 A1 | 1/2002 | Okuyama et al. |

(Continued)

FOREIGN PATENT DOCUMENTS

| CN | 101361146 B | 2/2009 |
| JP | H02-159008 A | 6/1990 |

(Continued)

OTHER PUBLICATIONS

An Office Action; "Notification of Reasons for Rejection," issued by the Japanese Patent Office on Dec. 2, 2014, which corresponds to Japanese Patent Application No. 2013-023450 and is related to U.S. Appl. No. 14/142,418; with English language translation.

*Primary Examiner* — Mark A Osele
*Assistant Examiner* — Christopher C Caillouet
(74) *Attorney, Agent, or Firm* — Studebaker & Brackett PC

(57) ABSTRACT

A method for producing an electronic component including a laminate, a circuit element provided therein, and external conductors electrically connected thereto. The method including steps of obtaining a mother laminate that has a plurality of the laminates arranged in a matrix-like state in a first direction and a second direction perpendicular thereto. The mother laminate is cut into the laminates. In the step of obtaining, the mother laminate is obtained such that the external conductors of two laminates adjacent in the first direction are joined, and circuit elements provided in the two laminates have a point-symmetrical relationship with each other. In the step of cutting, the mother laminate is cut along first cutoff lines extending in the second direction after the mother laminate is cut along second cutoff lines extending in the first direction. The external conductors are located on corresponding first cutoff lines.

3 Claims, 8 Drawing Sheets

(56) References Cited

U.S. PATENT DOCUMENTS

2008/0257488 A1    10/2008   Yamano
2012/0227250 A1     9/2012   Yamano

FOREIGN PATENT DOCUMENTS

| | | |
|---|---|---|
| JP | 05-308019 A | 11/1993 |
| JP | H08-167522 A | 6/1996 |
| JP | H11-16759 A | 1/1999 |
| JP | 2001-332424 A | 11/2001 |
| JP | 2003-347146 A | 12/2003 |
| JP | 2005-114552 A | 4/2005 |
| JP | 2006-114552 A | 4/2006 |
| JP | 2006-114626 A | 4/2006 |
| JP | 2010-165975 A | 7/2010 |
| JP | 2013-026257 A | 2/2013 |
| WO | 2007/080680 A1 | 7/2007 |

F I G . 5
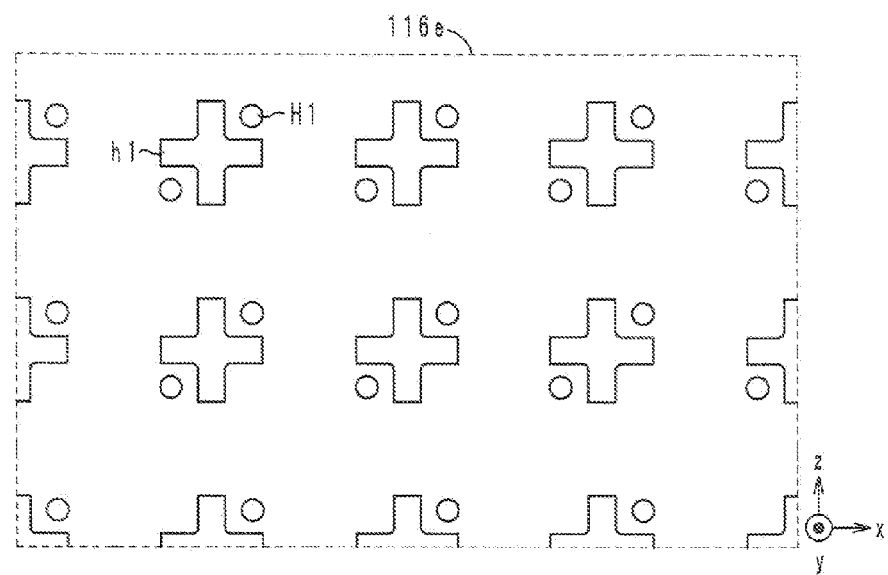
F I G . 6
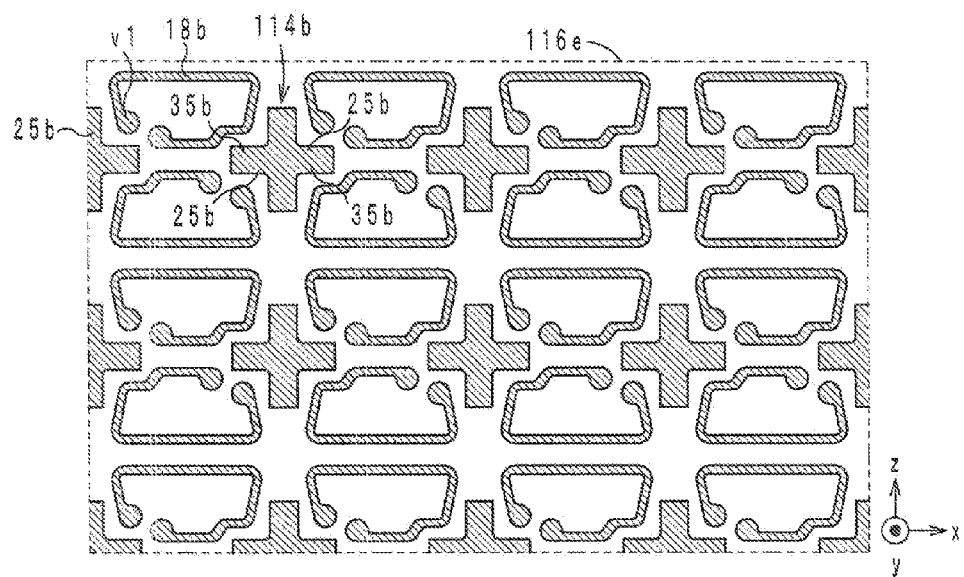

F I G. 7
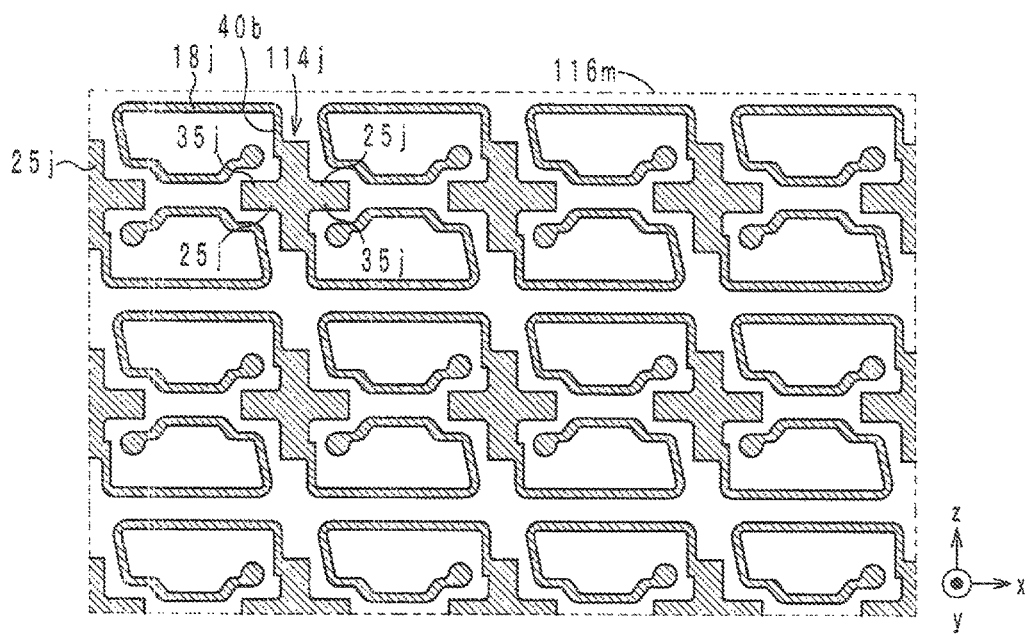
F I G. 8
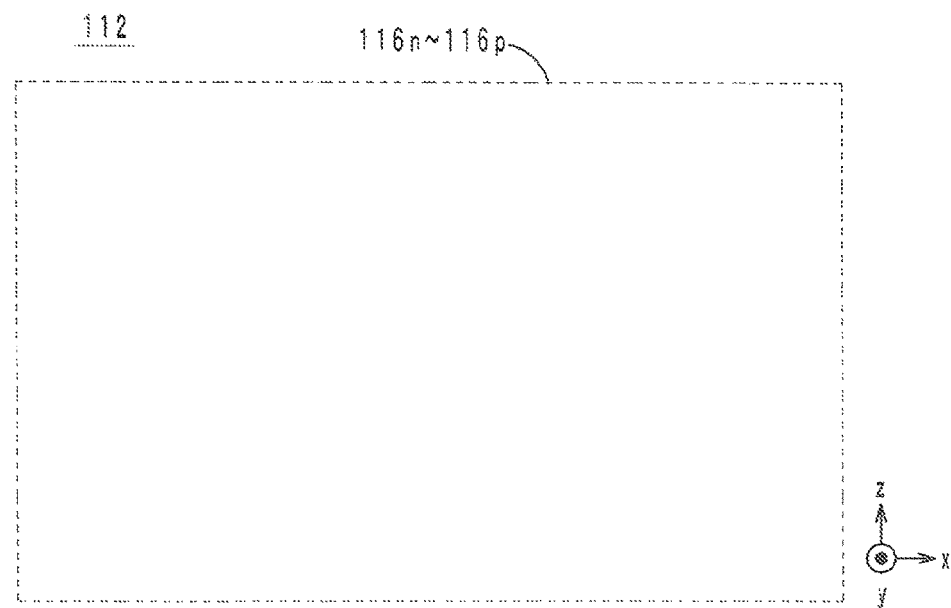

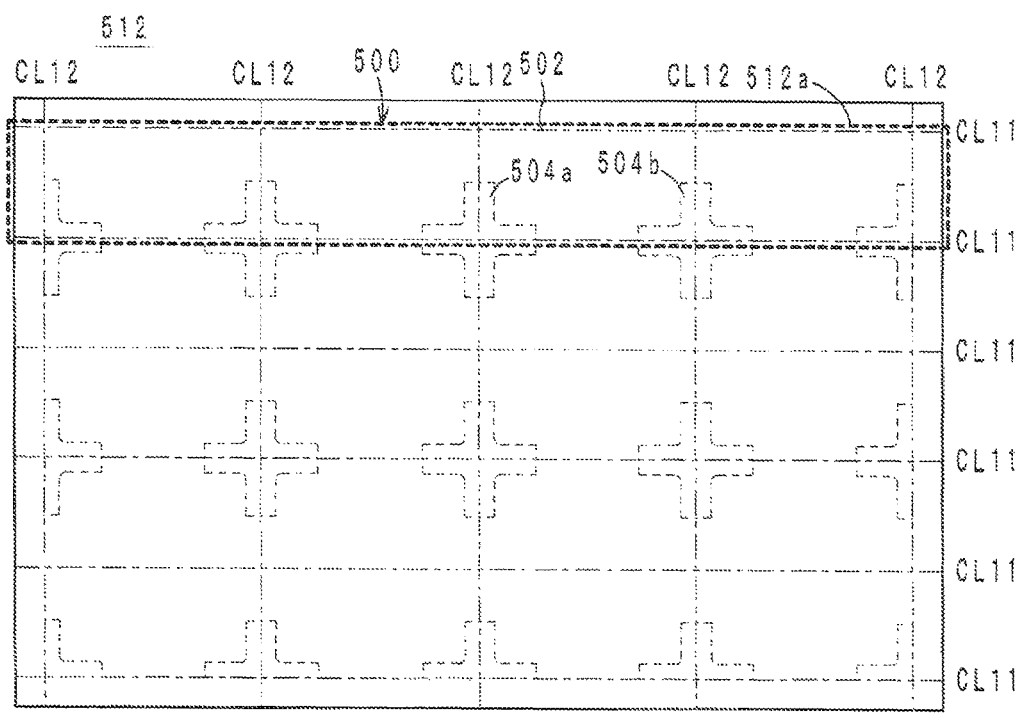

METHOD FOR PRODUCING ELECTRONIC COMPONENT

CROSS REFERENCE TO RELATED APPLICATIONS

This application claims benefit of priority to Japanese Patent Application No. 2013-023450 filed Feb. 8, 2013, the entire content of which is incorporated herein by reference.

TECHNICAL FIELD

The technical field relates to methods for producing electronic components, more particularly to a method for producing an electronic component with laminated insulating layers.

BACKGROUND

As a disclosure related to a conventional electronic component production method, a common-mode noise filter described in, for example, Japanese Patent Laid-Open Publication No. 2010-165975 is known. FIG. 11 is a transparent view of a mother laminate 512 for the common-mode noise filter 500 described in Japanese Patent Laid-Open Publication No. 2010-165975.

The common-mode noise filter 500 includes a laminate 502 and external electrodes 504a and 504b. Each of the external electrodes 504a and 504b extends across two surfaces of the laminate 502. The common-mode noise filter 500 is made by cutting the mother laminate 512 with the laminates 502 arranged in a matrix-like state. For example, the mother laminate 512 is cut along cutoff lines CL11 extending horizontally, and thereafter, along cutoff lines CL12 extending vertically.

Incidentally, cutting the mother laminate 512 along cutoff lines CL11 results in a strip 512a extending horizontally. At this time, the laminates 502 might be distorted for the following reasons. The external electrodes 504a and 504b are located on a corresponding cutoff line CL11. Accordingly, when the mother laminate 512 is cut along the cutoff line CL11, the external electrodes 504a and 504b, along with insulator layers, are cut. The external electrodes 504a and 504b are made of a conductor having a higher ductility than the ceramic of which the laminate 512 is made. Accordingly, the external electrodes 504a and 504b are more resistant to being cut than the laminate 512. Therefore, when the external electrodes 504a and 504b are cut, a significant force is applied to the external electrodes 504a and 504b, and is transmitted to the mother laminate 512. At this time, when the significant force is applied to the strip 512a, the strip 512a is susceptible to distortion, such as twist, because the strip 512a to be separated from the mother laminate 512 extends horizontally. As a result, the laminate 512 is distorted. Such distortion may cause cracks in the laminate 512.

SUMMARY

Therefore, an object of the present disclosure provides a method for producing an electronic component, capable of suppressing occurrence of distortion in the laminate, when the mother laminate is cut.

An embodiment of the present disclosure is directed to a method for producing an electronic component formed by laminating a plurality of insulator layers, the electronic component including a laminate with a mounting surface constituted by a series of first sides of the insulator layers, a circuit element provided in the laminate, and external conductors electrically connected to the circuit element and led out to the first sides, the method comprising steps of; obtaining a mother laminate that, when viewed in a plan view in a direction of lamination, has a plurality of the laminates arranged in a matrix-like state in a first direction and a second direction perpendicular to the first direction; and cutting the mother laminate into the laminates. Wherein, in the step of obtaining, the mother laminate is obtained such that the external conductors of two laminates adjacent in the first direction are joined, and circuit elements provided in the two laminates have a point-symmetrical relationship with each other, and the mother laminate is, in the step of cutting, cut along first cutoff lines extending in the second direction after the mother laminate is cut along second cutoff lines extending in the first direction, the external conductors being located on corresponding first cutoff lines.

BRIEF DESCRIPTION OF THE DRAWINGS

FIG. 5 is a plan view of the electronic component during production.

FIG. 6 is a plan view of the electronic component during production.

FIG. 7 is a plan view of the electronic component during production.

FIG. 8 is a plan view of the electronic component during production.

FIG. 11 is a perspective view of a mother laminate in a common-mode noise filter described in Japanese Patent Laid-Open Publication No. 2010-165975.

DETAILED DESCRIPTION

Hereinafter, a method for producing an electronic component according to an embodiment of the present disclosure will be described.

Configuration of Electronic Component

Figure 1:
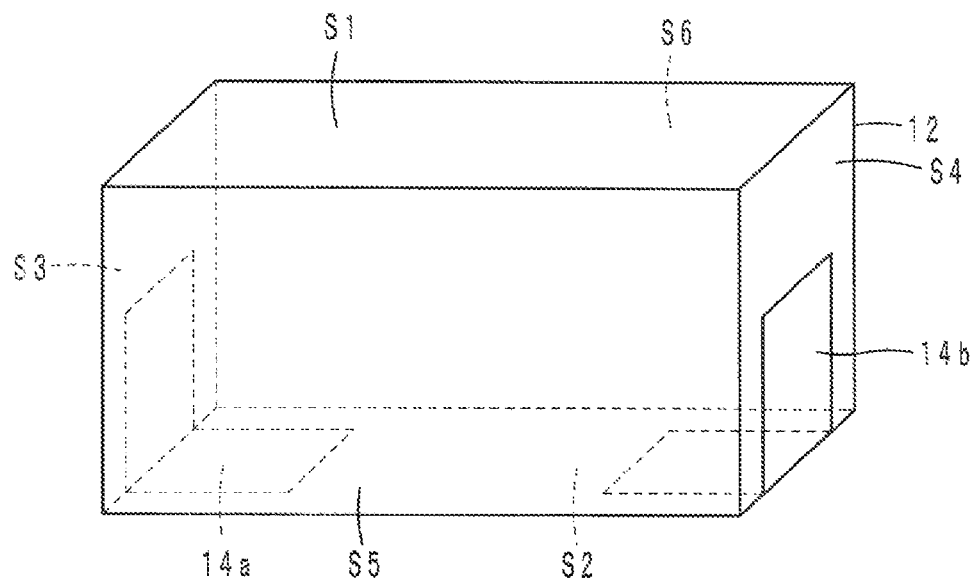
FIG. 1 is an external transparent view of an electronic component according to an embodiment.
Figure 1:
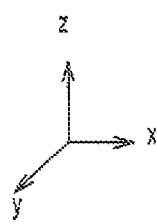
Figure 2:
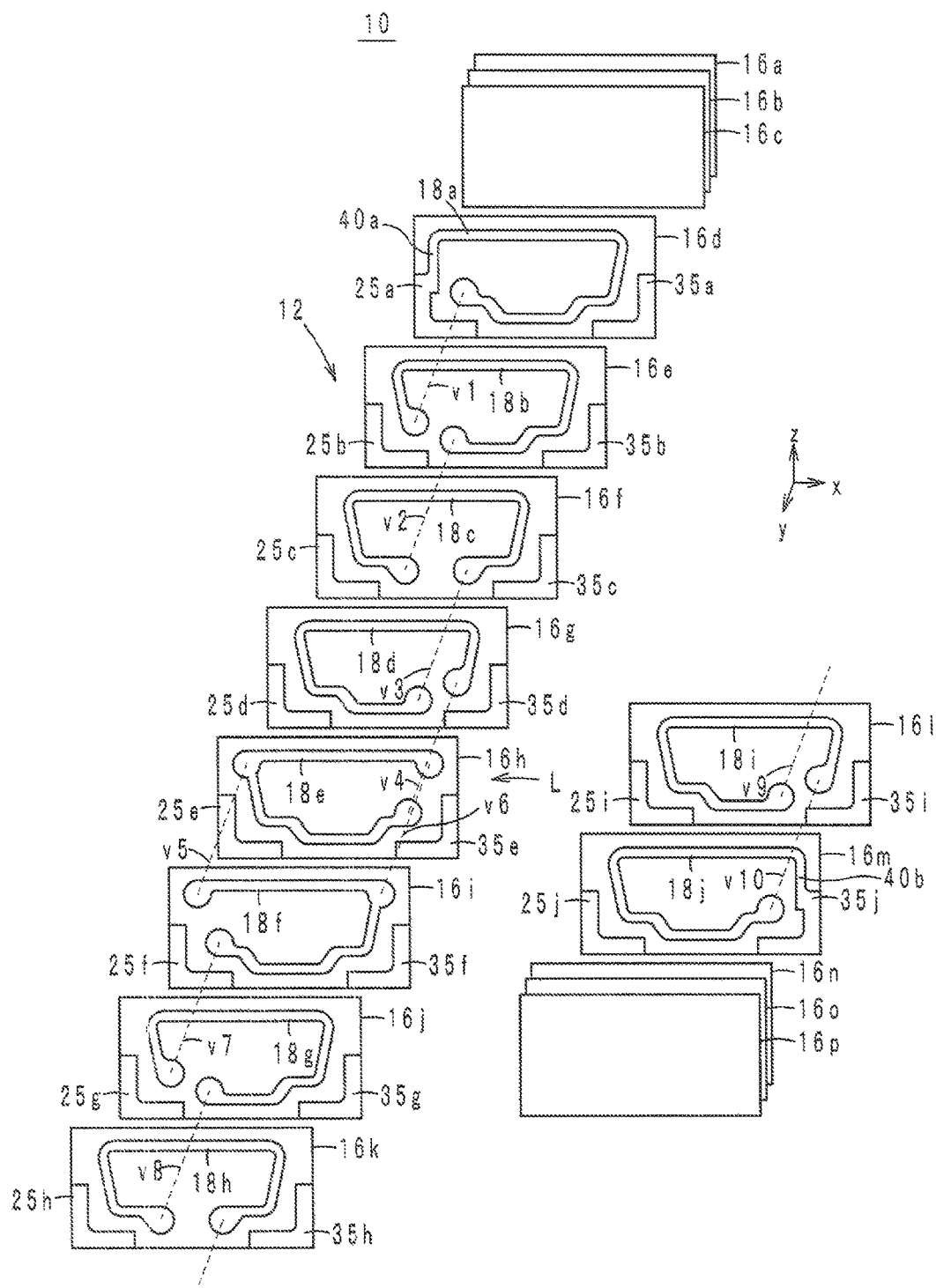
FIG. 2 is an exploded oblique view of the electronic component in FIG. 1.

The configuration of the electronic component according to the embodiment will be described below with reference to the drawings. FIG. 1 is an external perspective view of the electronic component 10 according to the embodiment. FIG. 2 is an exploded oblique view of the electronic component 10 in FIG. 1. In the following, the direction of lamination of the electronic component 10 will be defined as a y-axis direction. Moreover, when viewed in a plan view in the y-axis direction, the direction in which the long side of the electronic component 10 extends will be defined as an x-axis direction, and the direction in which the short side of the electronic component 10 extends will be defined as a z-axis direction.

The electronic component 10 includes a laminate 12, external electrodes 14a and 14b, lead-out conductors 40a and 40b, and a coil L, which is typical example of a circuit element, as shown in FIGS. 1 and 2.

The laminate 12 is in the shape of a rectangular solid formed by laminating a plurality of insulator layers 16a to 16p in this order, from the negative side toward the positive side in the y-axis direction, as shown in FIG. 2. Accordingly, the laminate 12 has a top surface S1, a bottom surface S2, end surfaces S3 and S4, and side surfaces S5 and S6. The top surface S1 is a surface of the laminate 12 on the positive side in the z-axis direction. The bottom surface S2 is a surface of the laminate 12 on the negative side in the z-axis direction, and serves as a mounting surface to face a circuit board when the electronic component 10 is mounted on the circuit board. The top surface S1 is formed by a series of the long sides of the insulator layers 16a to 16p on the positive side in the z-axis direction, and the bottom surface S2 is formed by a series of the long sides of the insulator layers 16a to 16p on the negative side in the z-axis direction. The end surfaces S3 and S4 are surfaces of the laminate 12 on the negative and positive sides, respectively, in the x-axis direction. The end surface S3 is formed by a series of the short sides of the insulator layers 16a to 16p on the negative side in the z-axis direction, and the end surface S4 is formed by a series of the short sides of the insulator layers 16a to 16p on the positive side in the z-axis direction. Moreover, the end surfaces S3 and S4 neighbor the bottom surface S2. The side surfaces S5 and S6 are surfaces of the laminate 12 on the positive and negative sides, respectively, in the y-axis direction.

The insulator layers 16a to 16p are in the shape of rectangles, as shown in FIG. 2, and are made of, for example, an insulating material mainly composed of borosilicate glass. In the following, the surfaces of the insulator layers 16a to 16p on the positive side in the y-axis direction will be referred to as the front faces, and the surfaces of the insulator layers 16a to 16p on the negative side in the y-axis direction will be referred to as the back faces.

The coil L is a circuit element provided in the laminate 12, and includes coil conductors 18a to 18j and via-hole conductors v1 to v10. The coil L is formed by connecting the coil conductors 18a to 18j by the via-hole conductors v1 to v10. Moreover, the coil L has a winding axis extending in the y-axis direction, and when viewed in a plan view from the positive side in the y-axis direction, the coil L spirals clockwise from the negative side toward the positive side in the y-axis direction.

The coil conductors 18a to 18j are provided on the front faces of the insulator layers 16d to 16m. The coil conductors 18a to 18j, when viewed in a plan view in the y-axis direction, overlap one another in the form of an annular path. Moreover, each of the coil conductors 18a to 18j is a linear conductor winding clockwise to a point at which the path is missing. In the following, the ends of the coil conductors 18a to 18j that are located downstream in the clockwise direction in a plan view from the positive side in the y-axis direction will be simply referred to as the downstream ends, and the ends of the coil conductors 18 that are located upstream in the clockwise direction in a plan view from the positive side in the y-axis direction will be referred to as the upstream ends. The coil conductors 18a to 18j thus configured are made of, for example, a conductive material mainly composed of Ag.

The via-hole conductors v1 to v4 pierce through the insulator layers 16e to 16h, respectively, in the y-axis direction. The via-hole conductors v5 and v6 pierce through the insulator layers 16i in the y-axis direction. The via-hole conductors v7 to v10 pierce through the insulator layers 16j to 16m, respectively, in the y-axis direction.

The via-hole conductor v1 connects the downstream end of the coil conductor 18a and the upstream end of the coil conductor 18b. The via-hole conductor v2 connects the downstream end of the coil conductor 18b and the upstream end of the coil conductor 18c. The via-hole conductor v3 connects the downstream end of the coil conductor 18c and the upstream end of the coil conductor 18d. The via-hole conductor v4 connects the downstream end of the coil conductor 18d and the upstream end of the coil conductor 18e.

The via-hole conductor v5 connects the coil conductor 18e and the upstream end of the coil conductor 18f. The via-hole conductor v6 connects the downstream end of the coil conductor 18e and the coil conductor 18f.

The via-hole conductor v7 connects the downstream end of the coil conductor 18f and the upstream end of the coil conductor 18g. The via-hole conductor v8 connects the downstream end of the coil conductor 18g and the upstream end of the coil conductor 18h. The via-hole conductor v9 connects the downstream end of the coil conductor 18h and the upstream end of the coil conductor 18i. The via-hole conductor v10 connects the downstream end of the coil conductor 18i and the upstream end of the coil conductor 18j.

The via-hole conductors v1 to v10 are made of, for example, a conductive material mainly composed of Ag.

The external electrode 14a is embedded in the laminate 12 so as to be exposed therefrom and extend across the bottom surface S2 and the end surface S3, as shown in FIG. 1. Accordingly, the external electrode 14a, when viewed in a plan view in the y-axis direction, has an L-like shape. Moreover, the external electrode 14a is formed by laminating external conductors 25a to 25j, as shown in FIG. 2.

The external conductors 25a to 25j pierce through the insulator layers 16d to 16m, respectively, in the y-axis direction, as shown in FIG. 2. The external conductors 25a to 25j have L-like shapes, and when viewed in a plan view in the y-axis direction, they are positioned at the corners where the short sides of the insulator layers 16d to 16m on the negative side in the x-axis direction intersect the long sides of the insulator layers 16d to 16m on the negative side in the z-axis direction. As a result, the external conductors 25a to 25j are led out to the long sides on the negative side in the z-axis direction and also to the short sides on the negative side in the x-axis direction that neighbor the long sides. The external conductors 25a to 25j are laminated and therefore electrically connected to one another.

The external electrode 14b is embedded in the laminate 12 so as to be exposed therefrom and extend across the bottom surface S2 and the end surface S4. Accordingly, the external electrode 14b, when viewed in a plan view in the y-axis direction, has an L-like shape. Moreover, the external electrode 14b is formed by laminating external conductors 35a to 35j, as shown in FIG. 2.

The external conductors 35a to 35j pierce through the insulator layers 16d to 16m, respectively, in the y-axis direction, as shown in FIG. 2. The external conductors 35a to 35j have L-like shapes, and when viewed in a plan view in the y-axis direction, they are positioned at the corners where the short sides of the insulator layers 16d to 16m on the positive side in the x-axis direction intersect the long sides of the insulator layers 16d to 16m on the negative side in the z-axis direction. As a result, the external conductors 35a to 35j are led out to the long sides on the negative side in the z-axis direction and the short sides on the positive side in the x-axis direction that neighbor the long sides. The external conductors 35a to 35j are laminated and therefore electrically connected to one another.

The lead-out conductor 40a is provided on the front face of the insulator layer 16d, so as to connect the upstream end of the coil conductor 18a and the external conductor 25a. As a result, the external electrode 14a is electrically connected to the coil L.

The lead-out conductor 40b is provided on the front face of the insulator layer 16m, so as to connect the downstream end of the coil conductor 18j and the external conductor 35j. As a result, the external electrode 14b is electrically connected to the coil L.

Method for Producing Electronic Component

The method for producing the electronic component 10 according to the present embodiment will be described below with reference to the drawings. FIGS. 3 through 9 are plan views of the electronic component 10 during production.

Figure 3:
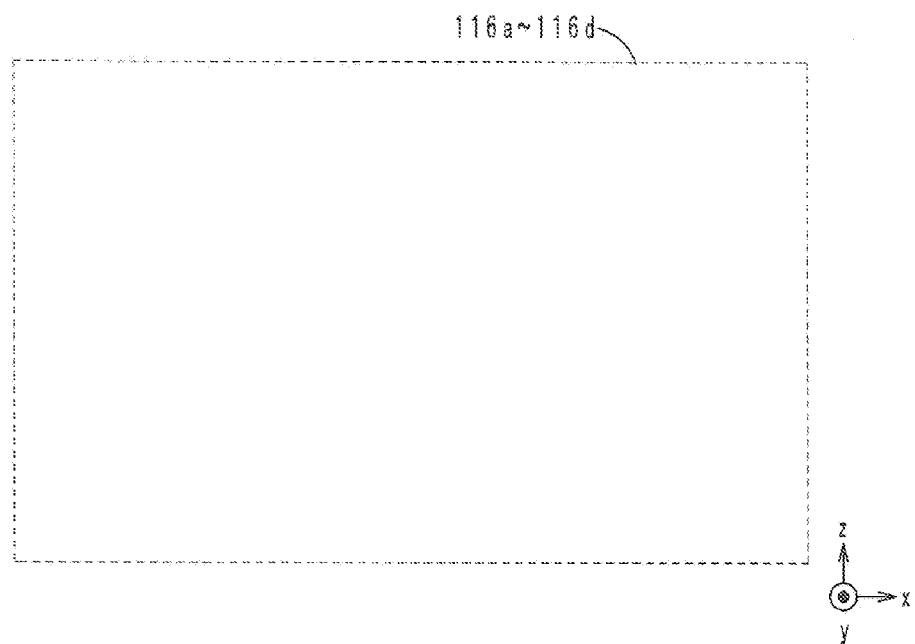
FIG. 3 is a plan view of the electronic component during production.

Initially, an insulating paste mainly composed of borosilicate glass is repeatedly applied by screen printing, thereby forming insulating paste layers 116a to 116d, as shown in FIG. 3. The insulating paste layers 116a to 116d are outer insulator layers positioned outside relative to the coil L and serving as insulator layers 16a to 16d.

Figure 4:
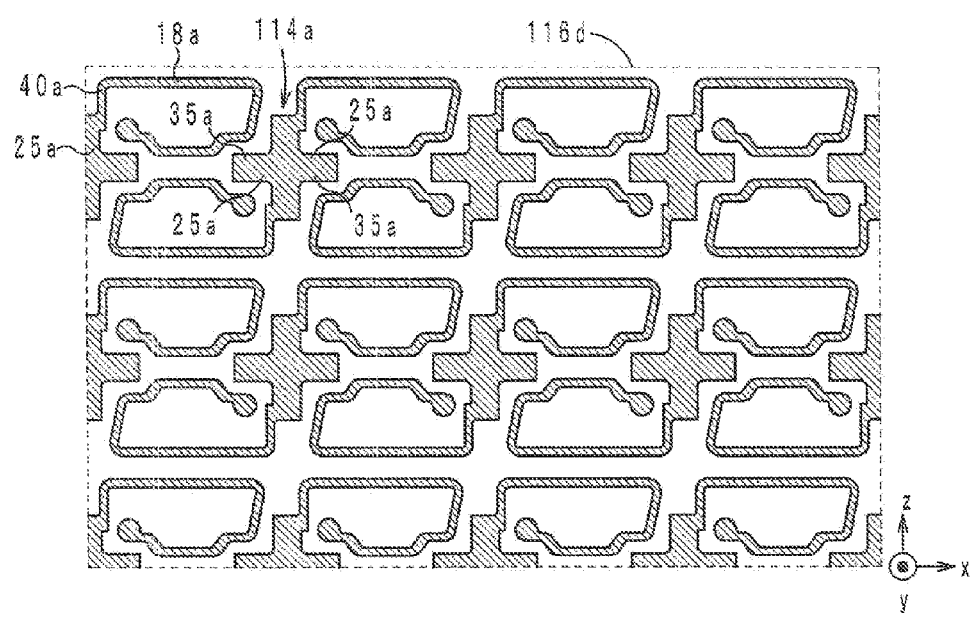
FIG. 4 is a plan view of the electronic component during production.

Next, coil conductors 18a, external conductors 25a and 35a, and lead-out conductors 40a are formed by photolithography, as shown in FIG. 4. Specifically, a photosensitive, conductive paste whose main metal component is Ag is applied to the insulating paste layer 116d by screen printing, thereby forming a conductive paste layer on the insulating paste layer 116d. In addition, the conductive paste layer is irradiated with ultraviolet light or suchlike through a photomask, and developed by an alkaline solution or suchlike. As a result, the coil conductors 18a, the external conductors 25a and 35a, and the lead-out conductors 40a are formed on the insulating paste layer 116d.

Note that the coil conductors 18a, the external conductors 25a and 35a, and the lead-out conductors 40a are formed in arrays in the z- and x-axis directions when they are viewed in a plan view in the y-axis direction. Note that the coil conductors 18a, the external conductors 25a and 35a, and the lead-out conductors 40a are arranged in the z-axis direction so as to be alternatingly inverted with respect to the z-axis direction. In the present embodiment, the coil conductors 18a, the external conductors 25a and 35a, and the lead-out conductors 40a are symmetrical to their neighboring counterparts in the z-axis direction with respect to a point. Moreover, the coil conductors 18a, the external conductors 25a and 35a, and the lead-out conductors 40a and their neighboring counterparts in the x-axis direction are oriented in the same direction. Such arrangements result in cross-shaped, united conductors 114a each being formed by two external conductors 25a joined with two external conductors 35a.

Next, an insulating paste layer 116e with openings h1 and via-holes H1 is formed by photolithography, as shown in FIG. 5. Specifically, a photosensitive, insulating paste is applied to the insulating paste layer 116d by screen printing, thereby forming a layer of insulating paste on the insulating paste layer 116d. In addition, the insulating paste layer is irradiated with ultraviolet light or suchlike through a photomask, and developed by an alkaline solution or suchlike. The insulating paste layer 116e is a paste layer serving as an insulator layer 16e. The opening h1 is a cross-shaped hole that matches the united conductor 114b.

Note that the openings h1 and the via-holes H1 are formed in arrays in the z- and x-axis directions when they are viewed in a plan view in the y-axis direction. In addition, the openings h1 and the via-holes H1 are arranged in the z-axis direction so as to be alternatingly inverted with respect to the z-axis direction.

Next, coil conductors 18b, external conductors 25b and 35b, and via-hole conductors v1 are formed by photolithography, as shown in FIG. 6. Specifically, a photosensitive, conductive paste whose main metal component is Ag is applied to the insulating paste layer 116e by screen printing, thereby forming a layer of conductive paste on the insulating paste layer 116e so as to fill the openings h1 and the via-holes H1. In addition, the layer of conductive paste is irradiated with ultraviolet light or suchlike through a photomask, and developed by an alkaline solution or suchlike. As a result, the external conductors 25b and 35b are formed in the openings h1, the via-hole conductors v1 are formed in the via-holes H1, and the coil conductors 18b are formed on the insulating paste layer 116e.

Note that the coil conductors 18b, the external conductors 25b and 35b, and the via-hole conductors v1 are formed in arrays in the z- and x-axis directions when they are viewed in a plan view in the y-axis direction. In addition, the coil conductors 18b, the external conductors 25b and 35b, and the via-hole conductors v1 are arranged in the z-axis direction so as to be alternatingly inverted with respect to the z-axis direction.

Thereafter, the same steps as shown in FIGS. 5 and 6 are repeated to form insulating paste layers 116f to 116m, coil conductors 18c to 18j, external conductors 25c to 25j and 35c to 35j, and via-hole conductors v2 to v10. As a result, the coil conductors 18j, the external conductors 25j and 35j, and the lead-out conductors 40b are formed on the insulating paste layer 116m, as shown in FIG. 7.

Next, an insulating paste is repeatedly applied by screen printing, thereby forming insulating paste layers 116n to 116p, as shown in FIG. 8. The insulating paste layers 116n to 116p are outer insulator layers positioned outside relative to the coil L and serving as insulator layers 16n to 16p. Through the above steps, a mother laminate 112 is obtained with laminates 12 arranged in arrays in the z- and x-axis directions.

Figure 9:
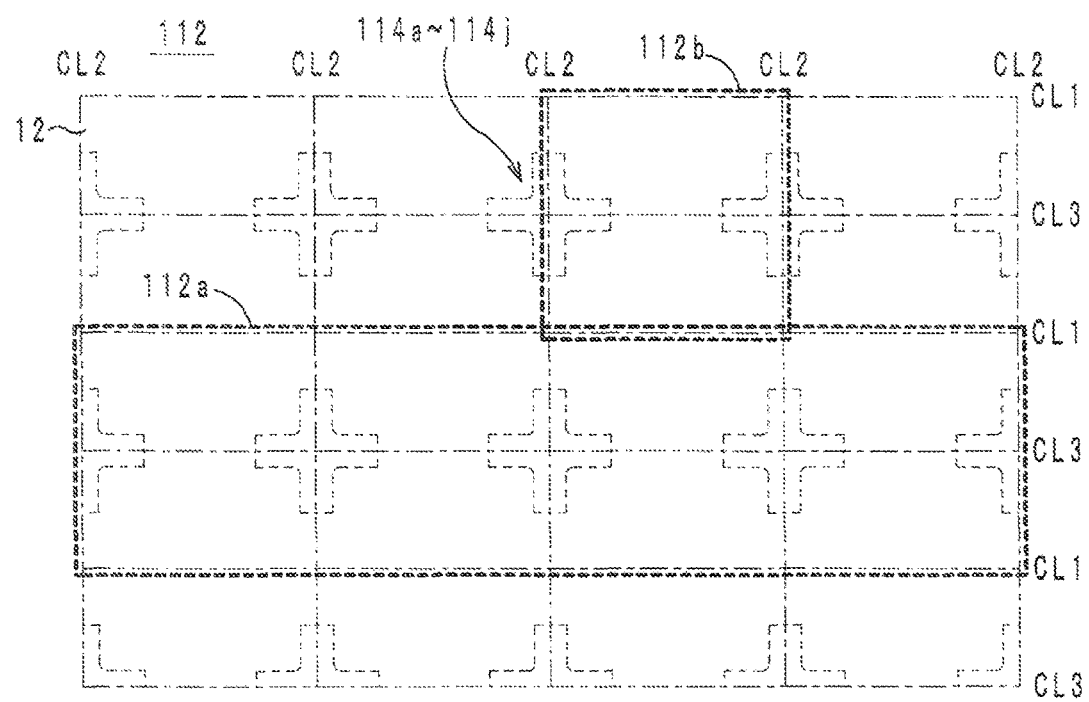
FIG. 9 is a plan view of the electronic component during production.
Figure 9:
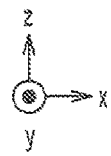

Note that in the mother laminate 112, the laminates 12 are arranged in the z-axis direction so as to be alternatingly inverted with respect to the z-axis direction, as shown in FIG. 9. As a result, the external conductors 25a to 25j are joined to the external conductors 35a to 35j to which they neighbor in the z-axis direction. Moreover, the external conductors 25a to 25j are joined to the external conductors 35a to 35j to which they neighbor in the x-axis direction. In this manner, pairs of external conductors 25a to 25j are joined with respective pairs of external conductors 35a to 35j, thereby forming cross-shaped, united conductors 114a to 114j. In FIG. 9, only the external conductors 25a to 25j and 35a to 35j (the united conductors 114a to 114j) are shown in perspective in order to avoid complicated illustration.

Next, the mother laminate 112 is cut into a plurality of unsintered laminates 12 by dicing or suchlike. In the step of cutting the mother laminate 112, the external electrodes 14a and 14b are exposed from the laminates 12 at edges made by the cutting. In the cutting step, an electroformed blade is used as a dicing blade. The blade is rotated at 30000 revolutions per minute [rpm] and 100 or more millimeters per second [mm/s]. The cutting step will be described in more detail below with reference to FIG. 9.

First, the mother laminate 112 is cut along cutoff lines CL1, which is one example of third cutoff lines. The cutoff lines CL1 extend in the x-axis direction where there are no united conductors 114a to 114j (i.e., no external conductors 25a to 25j and 35a to 35j). As a result, the mother laminate 112 is divided into a plurality of strips 112a extending in the x-axis direction.

Next, the mother laminate 112 is cut along cutoff lines CL2, which is one example of second cutoff lines. The cutoff lines CL2 extend in the z-axis direction. The united conductors 114a to 114j (i.e., the external conductors 25a to 25j and 35a to 35j) are located corresponding to the cutoff lines CL2. Accordingly, the united conductors 114a to 114j are divided into halves. Moreover, each strip 112a is divided into a plurality of strips 112b. Each strip 112b consists of two laminates 12 neighboring in the z-axis direction. Note that in FIG. 9, only one representative strip 112b is denoted by the reference character.

Next, the mother laminate 112 is cut along cutoff lines CL3, which is one example of first cutoff lines. The cutoff lines CL3 extend in the x-axis direction where united conductors 114a to 114j (i.e., external conductors 25a to 25j and 35a to 35j) are arranged. The cutoff lines CL1 and the cutoff lines CL3 alternate in the z-axis direction. As a result, the united conductors 114a to 114j are divided into external conductors 25a to 25j and 35a to 35j. Moreover, each strip 112b is divided into two laminates 12. In this manner, the mother laminate 112 is cut along the cutoff lines CL1 to CL3, resulting in a plurality of unsintered laminates 12. Note that the unsintered laminate 12 measures 0.4 mm to 0.5 mm×0.2 mm to 0.3 mm×0.2 mm to 0.3 mm.

Next, the unsintered laminates 12 are sintered under predetermined conditions. In addition, the sintered laminates 12 are barreled for beveling.

Lastly, the laminates 12 are plated with Ni and Sn, each to a thickness of 2 μm to 7 μm, where the external electrodes 14a and 14b are exposed. By the foregoing process, the electronic component 10 is completed.

Effects

The method for producing the electronic component 10 thus configured renders it possible to inhibit the laminates 12 from being distorted at the time of cutting the mother laminate 112. More specifically, the mother laminate 112 is cut along the cutoff lines CL1, CL2, and CL3 in this order. The united conductors 114a to 114j are not located corresponding to the cutoff lines CL1. Therefore, when the mother laminate 112 is cut along the cutoff lines CL1, the united conductors 114a to 114j are not cut, so that the laminates 12 are unlikely to be distorted.

Furthermore, when the mother laminate 112 is cut along the cutoff lines CL2, the mother laminate 112 is already cut into strips 112a along the cutoff lines CL1. Accordingly, the force applied to the strips 112a by cutting the united conductors 114a to 114j is not transmitted to any neighboring strips 112a. As a result, the mother laminate 112 is inhibited from being significantly distorted. That is, the laminates 12 are inhibited from being distorted.

Furthermore, when the mother laminate 112 is cut along the cutoff lines CL3, the mother laminate 112 is already cut into strips 112b along the cutoff lines CL2. Accordingly, the force applied to the strips 112b by cutting the united conductors 114a to 114j is not transmitted to any neighboring strips 112b. As a result, the mother laminate 112 is inhibited from being significantly distorted. That is, the laminates 12 are inhibited from being distorted.

Modification

Figure 10:
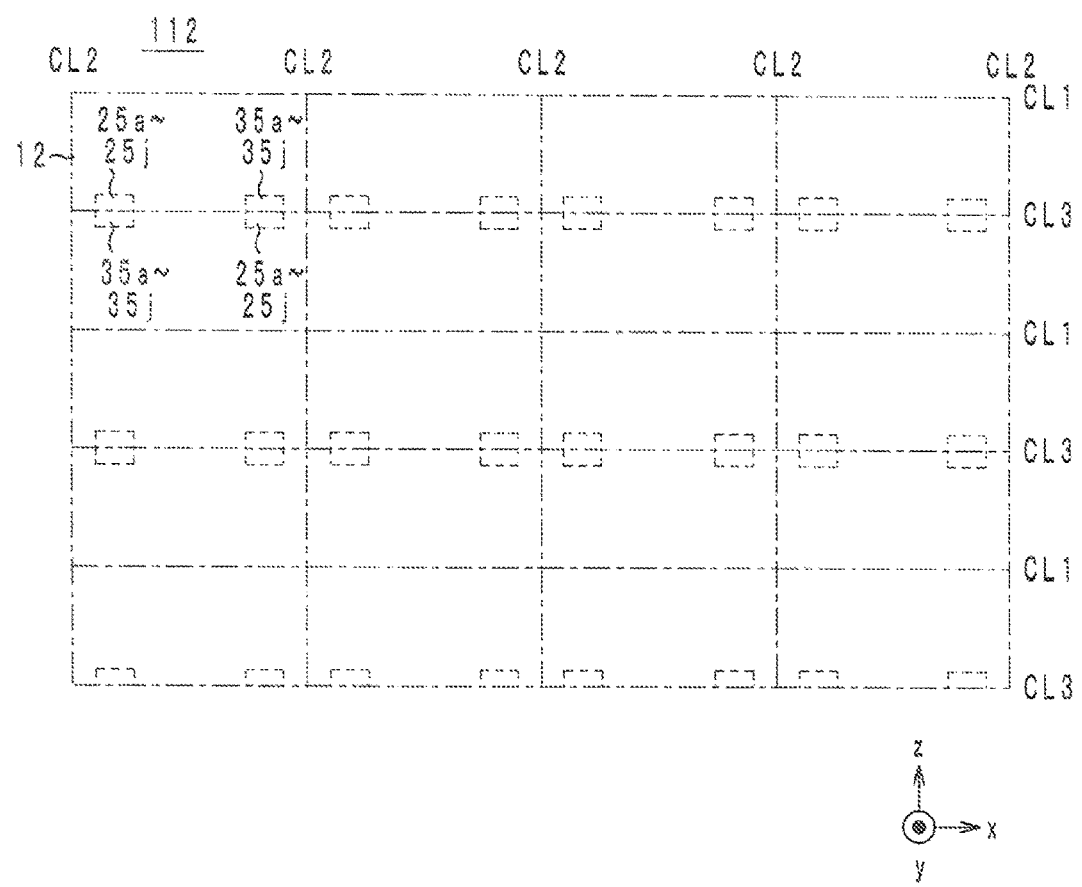
FIG. 10 is a plan view of the electronic component during production.

A method for producing an electronic component according to a modification will be described below with reference to the drawings. FIG. 10 is a plan view of the electronic component during production. Note that in FIG. 10, as in FIG. 9, only the external conductors 25a to 25j and 35a to 35j are shown in perspective in order to avoid a complicated illustration.

The electronic component according to the modification is the same as the electronic component 10 except for the shape of the external conductors 25a to 25j and 35a to 35j. Accordingly, only the external conductors 25a to 25j and 35a to 35j will be described below, and any descriptions of other components will be omitted.

The external conductors 25a to 25j and 35a to 35j are led out only to the long sides that constitute the bottom surface S2, and not to the short sides neighboring the long sides, as shown in FIG. 10. The method for producing such an electronic component can differ from the method for producing the electronic component 10 in terms of the cutting procedure.

More specifically, in the method for producing the electronic component, the mother laminate 112 may be cut along the cutoff lines in the order: CL2, CL1, and CL3; CL2, CL3, and CL1; or CL1, CL2, and CL3. That is, the mother laminate 112 may be cut along the cutoff lines CL2 before it is cut along the cutoff lines CL3. As a result, laminates 12 neighboring in the x-axis direction are separated from one another before the external conductors 25a to 25j and 35a, 35j are cut. Thus, deformation of the laminate 12 is inhibited.

Other Embodiments

The present disclosure is not limited to the methods for producing the electronic components 10 and the modification shown in FIG. 10, and variations can be made within the spirit and scope of the disclosure.

Note that for the electronic components 10 and the modification shown in FIG. 10, the mother laminate 112 is obtained using a printing process, but the mother laminate 112 may be obtained using a sequential pressure-bonding method in which ceramic green sheets with coil conductors provided thereon are laminated.

Note that the circuit element that is provided in each of the electronic components 10 and the modification shown in FIG. 10 is the coil L, but it may be a capacitor, a circuit element other than a coil and a capacitor, or a combination of such circuit elements.

Although the present disclosure has been described in connection with the preferred embodiment above, it is to be noted that various changes and modifications are possible to those who are skilled in the art. Such changes and modifications are to be understood as being within the scope of the disclosure.

What is claimed is:
1. A method for producing an electronic component formed by laminating a plurality of insulator layers, the electronic component including a laminate with a mounting surface constituted by a series of first sides of the insulator layers, a circuit element provided in the laminate, and external conductors electrically connected to the circuit element and led out to the first sides, the method comprising steps of:

obtaining a mother laminate that, when viewed in a plan view in a direction of lamination, has a plurality of the laminates arranged in a matrix-like state in a first direction and a second direction perpendicular to the first direction; and cutting the mother laminate into the laminates, wherein, in the step of obtaining, the mother laminate is obtained such that the external conductors of two laminates adjacent in the first direction are joined, and circuit elements provided in the two laminates have a point-symmetrical relationship with each other, in the step of cutting, the mother laminate is cut along first cutoff lines extending in the second direction after the mother laminate is cut along second cutoff lines extending in the first direction, the external conductors being located on the first cutoff lines, and a number of the external conductors per laminate on each of the second cutoff lines is less than a number of the external conductors per laminate on each of the first cutoff lines.

2. A method for producing an electronic component formed by laminating a plurality of insulator layers, the electronic component including a laminate with a mounting surface constituted by a series of first sides of the insulator layers, a circuit element provided in the laminate, and external conductors electrically connected to the circuit element and led out to the first sides, the method comprising steps of:

obtaining a mother laminate that, when viewed in a plan view in a direction of lamination, has a plurality of the laminates arranged in a matrix-like state in a first direction and a second direction perpendicular to the first direction; and cutting the mother laminate into the laminates, wherein, in the step of obtaining, the mother laminate is obtained such that the external conductors of two laminates adjacent in the first direction are joined, and circuit elements provided in the two laminates have a point-symmetrical relationship with each other, in the step of cutting, the mother laminate is cut along first cutoff lines extending in the second direction after the mother laminate is cut along second cutoff lines extending in the first direction, the external conductors being located on the first cutoff line, the external conductors include first and second external conductors, the first external conductor being led out to the first side and a second side adjacent to the first side, the second external conductor being led out to the first side and a third side adjacent to the first side, in the step of obtaining, the mother laminate is obtained with the first external conductors of each laminate joined to the second external conductors of another laminate adjacent in the second direction, and in the step of cutting, the mother laminate is cut along third cutoff lines extending in the second direction, then along the second cutoff lines, and further along first cutoff lines, the first and second external conductors being absent from the third cutoff lines.

3. The method according to claim 1, wherein the external conductors are electrically connected to the circuit element and led out to only the first sides and not to other sides of the insulator layers.

* * * * *